United States Patent
Herdendorf et al.

(10) Patent No.: US 7,452,213 B2
(45) Date of Patent: Nov. 18, 2008

(54) ELECTRICAL CONTACTS WITH COMPLIANT SUPPORTS

(75) Inventors: Brett Robert Herdendorf, Mound, MN (US); Ronald Eldon Anderson, Lakeville, MN (US); Michael Jon Roe, Becker, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 0 days.

(21) Appl. No.: 11/517,842

(22) Filed: Sep. 8, 2006

(65) Prior Publication Data
US 2008/0064234 A1   Mar. 13, 2008

(51) Int. Cl.
*H01R 12/00* (2006.01)
(52) U.S. Cl. .................... 439/67; 439/76.1
(58) Field of Classification Search .................... 439/67, 439/76.1, 77
See application file for complete search history.

(56) References Cited

U.S. PATENT DOCUMENTS

| | | | | |
|---|---|---|---|---|
| 2,971,179 | A | * | 2/1961 | Heuer .................... 439/61 |
| 4,468,074 | A | | 8/1984 | Gordon |
| 4,520,555 | A | | 6/1985 | Gyi et al. |
| 4,645,280 | A | | 2/1987 | Gordon et al. |
| 4,766,371 | A | * | 8/1988 | Moriya .................... 324/763 |
| 5,198,945 | A | | 3/1993 | Blaeser et al. |
| 5,496,182 | A | * | 3/1996 | Yasumura .................... 439/62 |
| 5,675,082 | A | | 10/1997 | Marr et al. |
| 5,682,780 | A | | 11/1997 | Girard |
| 5,786,677 | A | | 7/1998 | Marr |
| 5,844,420 | A | | 12/1998 | Weber et al. |
| 6,034,851 | A | | 3/2000 | Zarouri et al. |
| 6,125,003 | A | | 9/2000 | Tsuda et al. |
| 6,132,554 | A | | 10/2000 | Traise et al. |
| 6,140,661 | A | | 10/2000 | Nodelman |
| 6,163,950 | A | | 12/2000 | Bodiker, II et al. |
| 6,255,750 | B1 | | 7/2001 | Mohajerani et al. |
| 6,307,467 | B1 | | 10/2001 | Starkey et al. |
| 6,459,260 | B1 | | 10/2002 | Bonin et al. |
| 6,483,670 | B1 | | 11/2002 | Watanabe |
| 6,487,028 | B1 | | 11/2002 | Sri-Jayantha et al. |

(Continued)

OTHER PUBLICATIONS

Genetec Technology Berhard, "Auto Shunt Machine—Automatic HGA Shunting System," http://genetec.net/machine/Shunting.htm, printed Jan. 7, 2005.

(Continued)

*Primary Examiner*—Khiem Nguyen
(74) *Attorney, Agent, or Firm*—Shumaker & Sieffert, P.A.

(57) ABSTRACT

An assembly comprises a flex circuit including a first set of electrical contacts on a first side of the flex circuit and a compliant support backing adjacent a second side of the flex circuit and opposite the set of electrical contacts. The first set of electrical contacts is configured to connect to a second set of electrical contacts on an electronic component. The compliant support backing includes a set of support elements that individually support the first set of electrical contacts to increase the contact pressure between the first set of electrical contacts and the second set of electrical contacts when the flex circuit is connected to the electronic component. Embodiments may provide robust electrical contracts which provide a reliable connection useful for testing electronic components, such as head gimbal assemblies.

18 Claims, 5 Drawing Sheets

U.S. PATENT DOCUMENTS

| | | |
|---|---|---|
| 6,512,367 B2 | 1/2003 | Liu et al. |
| 6,566,870 B2 | 5/2003 | Sorenson et al. |
| 6,580,572 B1 | 6/2003 | Yao et al. |
| 6,704,165 B2 | 3/2004 | Kube et al. |
| 6,717,776 B2 | 4/2004 | Boutaghou |
| 6,789,659 B2 | 9/2004 | Spejna et al. |
| 6,801,387 B1 | 10/2004 | Rahman |
| 7,084,654 B2 | 8/2006 | Zhao et al. |
| 7,127,799 B2 | 10/2006 | Girard et al. |
| 7,159,299 B1 | 1/2007 | McMunigal et al. |
| 7,379,265 B2 | 5/2008 | Wang et al. |
| 2002/0039253 A1 | 4/2002 | Imai et al. |
| 2002/0053590 A1 | 5/2002 | Lennard et al. |
| 2002/0069510 A1 | 6/2002 | Girard et al. |
| 2002/0075602 A1 | 6/2002 | Mangold et al. |
| 2003/0107839 A1 | 6/2003 | Smith |
| 2003/0179493 A1 | 9/2003 | Kim |
| 2003/0182788 A1 | 10/2003 | Fayeulle et al. |
| 2004/0213138 A1 | 10/2004 | Kim |

OTHER PUBLICATIONS

Joseph Ogando, "Intelligent Fasteners," Design News, Oct. 20, 2003, pp. 1-5, www.designnews.com/index.asp?layout=article&arcticleid=CA328003&sst=001&pubdate, printed Oct. 23, 2006.

Anderson et al, "Method and Apparatus For Head Gimbal Assembly Testing," U.S. Appl. No. 11/056,337, filed Feb. 11, 2005.

\* cited by examiner

ELECTRICAL CONTACTS WITH COMPLIANT SUPPORTS

TECHNICAL FIELD

The invention relates to electrical contacts for electrical circuits.

BACKGROUND

Testing of electrical components for electronic devices is often performed to ensure the components are functional and perform within specified limits. During such testing, electric components that fail to meet the specified limits may be removed from the supply of electrical components used in the assembly of an electric device. Testing the functionality of electrical components can require reliable and repeatable electric connection between a testing device and a multitude of electrical components.

For example, in the disc drive industry, head gimbal assemblies (HGAs) may be individually tested prior to installation in a disc drive. Testing requires a reliable high bandwidth electric interconnect with an HGA. The electric interconnect generally includes a connection between a set of electrical contacts on the HGA and a corresponding set of electrical contacts on a testing module. As disc drives become smaller, electrical contacts of HGAs also become smaller, which complicates the ability to form a reliable connection with an HGA during testing.

SUMMARY

The electrical contacts on a testing module that connect to head gimbal assemblies (HGAs) may become unusable as a result of repeated use. Electrical contacts may degrade analog signals from HGAs thereby preventing accurate testing of the HGAs. For example, a broken solder joint that connects one of the electrical contacts to a trace on a circuit of the testing module would make the electrical contacts unusable. As another example, worn electrical contact surfaces may significantly degrade signals passing over electrical contacts. Worn-out or broken electrical contracts on a testing module can prevent accurate testing of HGAs.

In general, the invention is directed to techniques for reliably forming an electrical connection between two sets of electrical contacts. One set of electrical contacts is part of a flex circuit. A compliant support backing provides stiffness to the portion of the flex circuit including the set of electrical contacts. The electrical contacts may include over plating on pads such that the electrical contacts are raised relative to other traces on the flex circuit. In some embodiments, a compliant support backing that supports electrical contacts includes a plurality of fingers to support each electrical contact separately. This may increase the reliability of a connection that utilizes the electrical contacts on the flex circuit.

In one embodiment, the invention is directed to an assembly comprising a flex circuit including a first set of electrical contacts on a first side of the flex circuit and a compliant support backing adjacent a second side of the flex circuit and opposite the set of electrical contacts. The first set of electrical contacts is configured to connect to a second set of electrical contacts on an electronic component. The compliant support backing includes a set of support elements that individually support the first set of electrical contacts to increase contact pressure between the first set of electrical contacts and the second set of electrical contacts when the flex circuit is connected to the electronic component.

In another embodiment, the invention is directed to a circuit comprising a substrate, a set of traces that terminate near an edge of the substrate and a set of plated electrical contacts that connect to the set of traces, wherein the set of plated electrical contacts is located near the edge of the substrate.

In another embodiment, the invention is directed to a method comprising positioning a flex circuit having a first set of electrical contacts to connect the first set of electrical contacts with a second set of electrical contacts of a head gimbal assembly (HGA). The flex circuit is part of an assembly that further includes a compliant support backing adjacent to the flex circuit and opposite the first set of electrical contacts. The compliant support backing supports the flex circuit to allow increased contact pressure between the second set of electrical contacts and the first set of electrical contacts. The method further includes positioning the HGA adjacent to a rotating disc such that the HGA is supported by an air bearing between the rotating disc and the HGA.

Embodiments of the invention may provide one or more of the following advantages. In particular, embodiments of the invention may provide electrical contacts without solder joint or other intermediate connection device between the trace of a flex circuit and a separate electrical contact. In this manner, embodiments may provide robust electrical contacts useful in testing equipment for separately testing electronic components. Furthermore, embodiments of the invention provide sets of electrical contacts wherein each of the electrical contacts is individually compliant. This may provide a consistent connection force between electrical contacts, even if electrical contacts are worn and may increase the speed at which connecting electrical contacts creates useable electrical connections.

The details of one or more embodiments of the invention are set forth in the accompanying drawings and the description below. Other features, objects, and advantages of the invention will be apparent from the description and drawings, and from the claims.

DETAILED DESCRIPTION

Figure 1A:
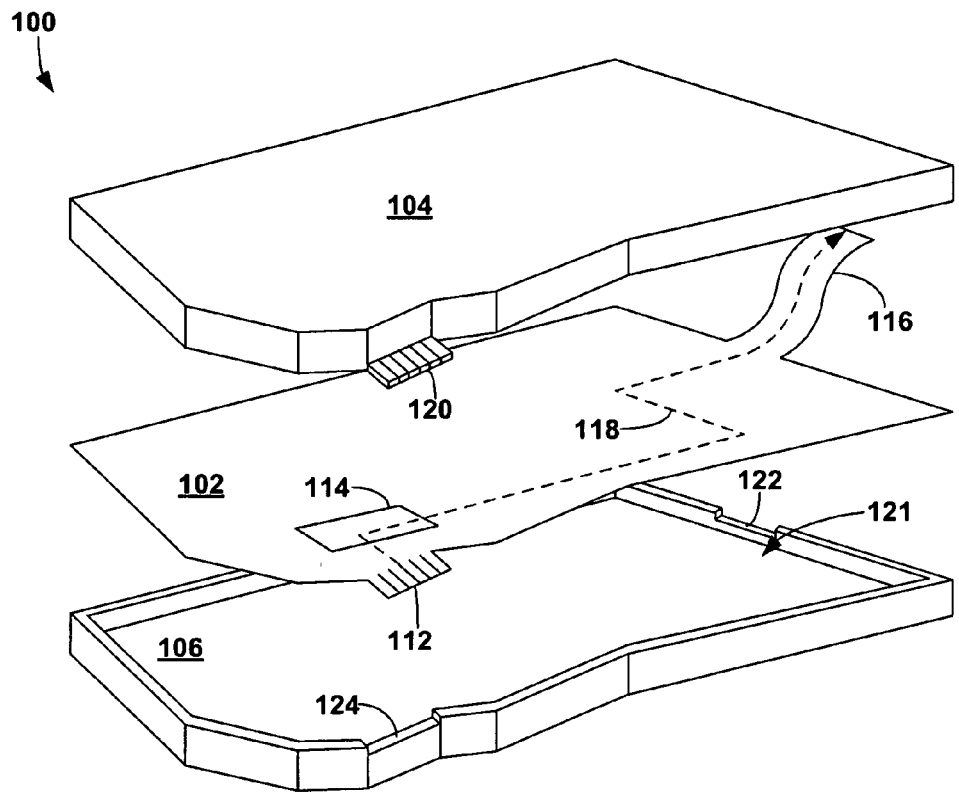
FIGS. 1A-1C illustrate an assembly including a flex circuit mounted between a bottom cover and a top cover. The top cover includes a compliant support backing for a plurality for electrical contacts on the flex circuit.
Figure 1B:
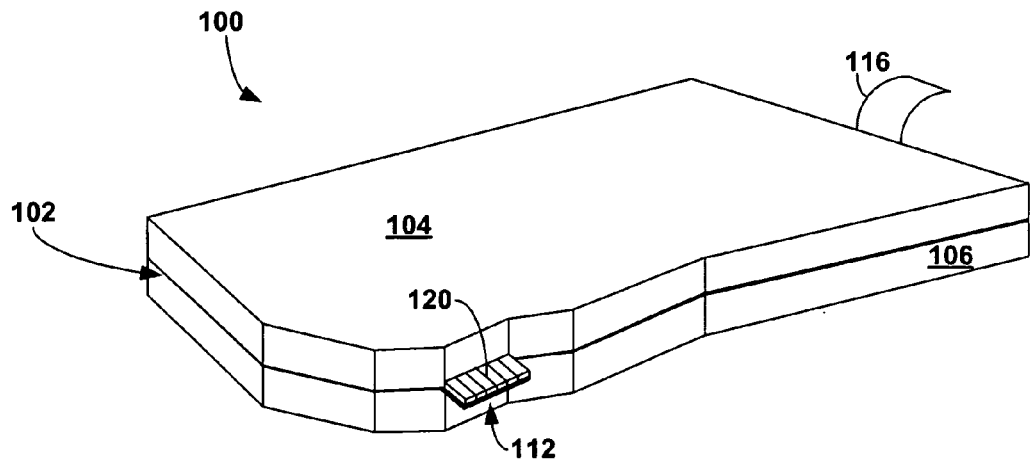
Figure 1C:
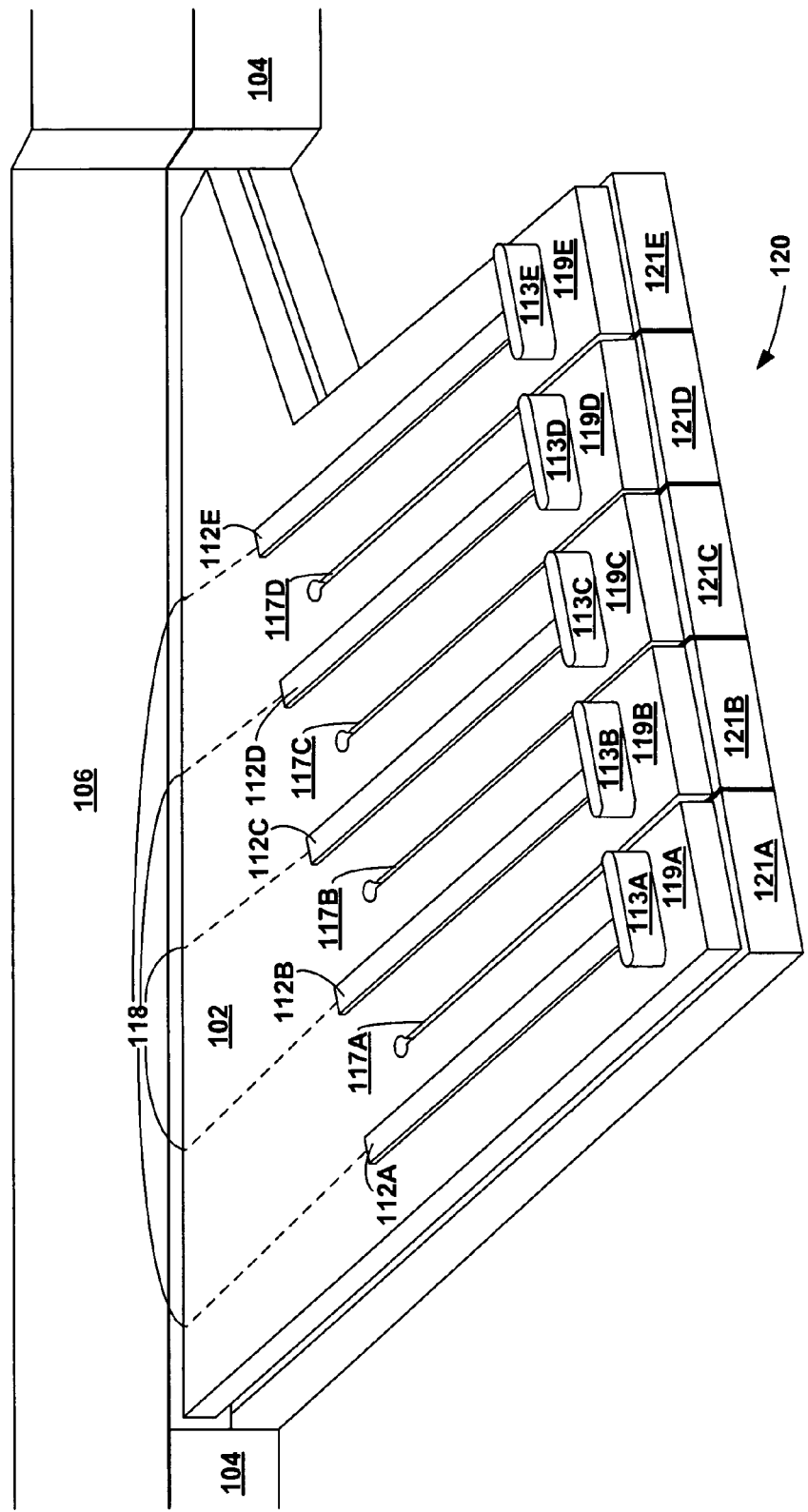

FIGS. 1A-1C illustrate a wide view of assembly 100. Assembly 100 includes flex circuit 102 with electrical contacts 112A-112E ("contacts 112"). Assembly 100 also includes top cover 104 with compliant support backing 120 and bottom cover 106. In this description, the terms top and bottom are merely relative and are not meant to indicate any particular orientation of assembly 100 or its components. For reference, FIG. 1A illustrates an exploded view of assembly 100, and FIG. 1B illustrates a collapsed view of assembly 100. FIG. 1C illustrates a close-up view of electrical contacts 112 and compliant support backing 120.

Flex circuit 102 is sandwiched between bottom cover 106 and top cover 104. Bottom cover 106 includes recess 121, which is sized to hold flex circuit 102. In particular, recess 121 provides clearance for electrical components on flex circuit 102. Bottom cover 106 also includes slot 124 to allow electrical contacts 112 to fit outside recess 121 and slot 122 to allow flex circuit tail 116 to fit outside recess 121. Bottom cover 106 substantially covers the bottom side of flex circuit 102 except for a portion adjacent to electrical contacts 112. Top cover 104 substantially covers the top side of flex circuit 102 and includes compliant support backing 120 adjacent to electrical contacts 112. Bottom cover 106 and top cover 104 may be made from metal, such as aluminum or stainless steel, plastic or other material. As shown in FIG. 1B, bottom cover 106 and top cover 104 combine to substantially enclose flex circuit 102.

Flex circuit 102 includes electrical contacts 112, which are configured to connect to electrical contacts on a separate electronic component, such as a head gimbal assembly (HGA). Flex circuit 102 comprises a flexible substrate. For example, the flexible substrate may comprise plastic, thin-metal film and/or other flexible material. Traces 118 are formed on top of the substrate. Traces 118, which provide electrical connections either directly or through additional electronic components (not shown) between electrical contacts 112 and flex circuit tail 116. Traces 118 terminate at electrical contacts 112, which are located near an edge of the substrate. In one embodiment, traces 118 may be continuous copper traces.

In a typical embodiment, read/write interface device 114 is connected to traces 118 adjacent to electrical contacts 112. The location of read/write interface device 114 minimizes distortion of a signal transferred over electrical contacts 112 by minimizing the electrical length of the unamplified signal between read/write interface device 114 and contacts 112. Additionally, traces 118 and electrical contacts 112 can be designed in such a way as to provide a controlled impedance signal path (transmission line). Flex circuit 102 may further include additional electronic components (not shown), e.g., components to process signals received via electrical contacts 112.

As shown in FIG. 1C, electrical contacts 112 include raised pads 113A-113E ("pads 113"). Pads 113 are part of electrical contacts 112 and comprise an electrically conductive material, such as copper. Pads 113 are higher than traces 118 and the other portions of electrical contacts 112. As an example, pads 113 may be formed using plating techniques. In such an example, pads 113 may be formed from one or more layers over plated directly on top of electrical contacts 112. One advantage of plating techniques is that no solder is required to attach pads 113 to the remaining portions of electrical contacts 112, which prevents mechanical stress problems associated with a solder joint.

Electrical contacts 112 are separated by slits 117A-117D ("slits 117"). Slits 117 are reliefs that allow each of electrical contacts 112 to move independently on separate fingers 119A-119E ("fingers 119"). This may improve connections between electrical contacts 112 and electrical contacts on a device that connects to assembly 100 via electrical contacts 112. For example, as shown in FIGS. 2A-2C, an HGA may connect to assembly 100 via electrical contacts 112.

Electrical contacts 112 are supported by compliant support backing 120, which is part of top cover 104. Compliant support backing 120 is stiffer than the substrate of flex circuit 102. Generally, compliant support backing 120 is the same material as top cover 104. For example, compliant support backing 120 may be made from metal, such as aluminum or stainless steel, plastic or other material. Compliant support backing 120 includes support elements 121A-121E ("support elements 121"). Support elements 121 individually support electrical contacts 112. The stiffness of support elements 121 provides a consistent contact pressure between contact pads 113 and a corresponding set of electrical contacts that connect to contact pads 113. An exemplary system that includes a set of electrical contacts individually supported by support elements to increase contact pressure between the electrical contacts and electrical contacts on a separate device is shown in FIG. 2C.

Figure 2A:
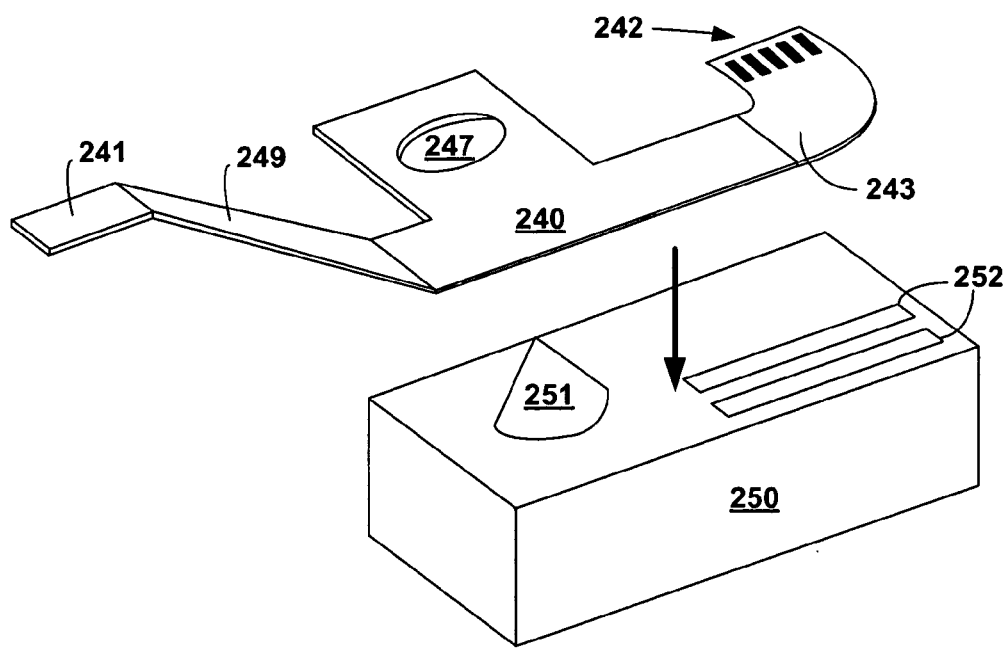
FIGS. 2A-2C illustrate techniques for testing a head gimbal assembly (HGA) that utilize the assembly of FIGS. 1A-1C to provide an electrical connection between the HGA and a test module.
Figure 2B:
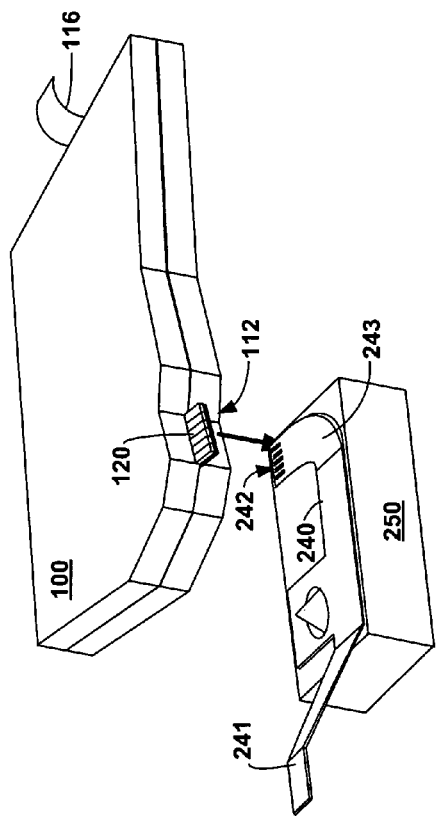
Figure 2C:
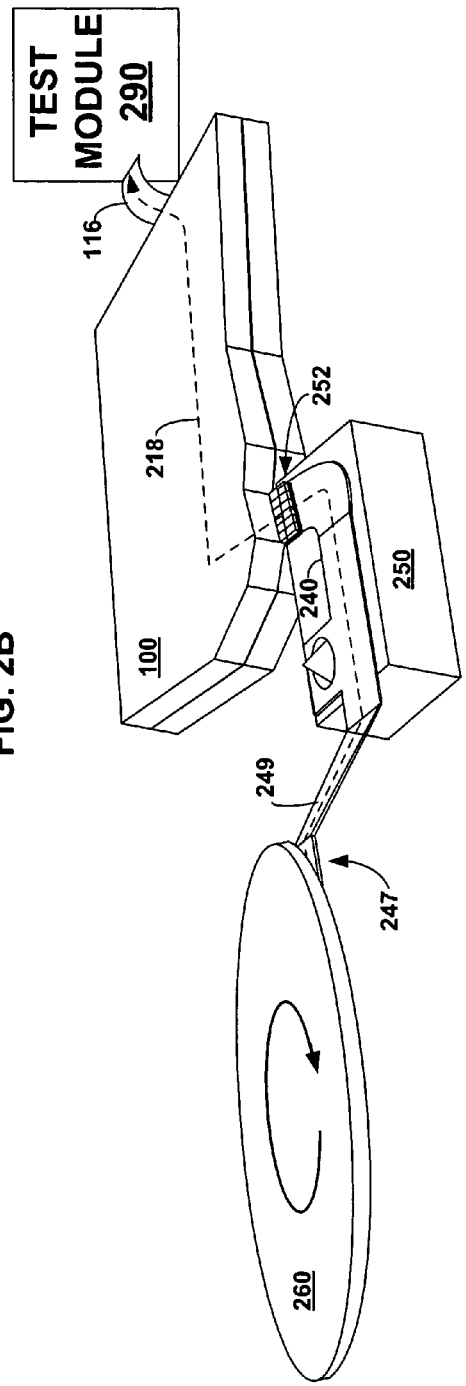

FIGS. 2A-2C illustrate perspective views for testing head gimbal assembly 240 (HGA 240). As shown in FIG. 2C, assembly 100 of FIG. 1 provides connection 218 between HGA 240 and test module 290. HGA 240 includes head 241, which flies above the surface of a disc and contains read and write transducers. The operation of transducers on head 241 is controlled via electrical contacts 242. Head 241 is supported by load beam 249. Load beam 249 provides a spring force to hold HGA 240 adjacent to a rotating disc such as test disc 260. For example, load beam 249 may be a thin, metal structure.

In FIG. 2A, HGA 240 is placed on base 250. For example, HGA 240 may be placed on base 250 using automated pick and place techniques. HGA 240 includes boss hole 247, which lines up boss hole pin 251 on base 250. HGA 240 may also include one or more alignment holes (not shown) that line up with alignment pins (not shown) on base 250. Techniques for precisely mounting an HGA are described in United States Patent Publication 2005/020979 by Anderson et al., the entire content of which is incorporated herein by reference. As HGA 240 is placed on base 250, HGA tail 243 is also pushed into position. Base 250 also includes vacuum slots 252, which use suction to hold HGA tail 243 securely to base 250. The described techniques to precisely position HGA 240 on base 250 are merely exemplary and other techniques to position HGA 240 on base 250 may be used.

In FIG. 2B, after HGA 240 is placed on base 250, assembly 100 is moved into position to clamps HGA tail 243 against base 250. This forms a connection between electrical contacts 112 and electrical contacts 242. Assembly 100 clamps HGA tail 243 against base 250. Assembly 100 may be moved automatically using a linkage, using linear actuators or by using other techniques. Assembly 100 is lowered adjacent to base 250 such that electrical contacts 112 press on electrical contacts 242. Support elements 121 (labeled in FIG. 1C) of support backing 120 individually support electrical contacts 112 to provide a consistent contact pressure between electrical contacts 112 and electrical contacts 242 on HGA 240.

In FIG. 2C, base 250 is moved to locate HGA 240 adjacent to test disc 260 as test disc 260 rotates. For example, base 250 may be connected to a mechanism, such as a four-bar linkage, to locate HGA 240 adjacent to test disc 260. The movement of base 250 may be precisely controlled to prevent head 241 from contacting test disc 260. Once HGA 240 is adjacent to test disc 260, head 241 is prevented from contacting test disc 260 by air bearing 247, which forms between head 241 test disc 260 as a result of the fluid (air) flow created by the rotation of test disc 260. Load beam 249 provides a spring force to hold head 241 adjacent to test disc 260.

Also shown in FIG. 2C, flex circuit tail 116 is connected to test module 290. In some embodiments, flex circuit tail 116 may be connected to test module 290 throughout the positioning of assembly 100, which in other embodiments flex circuit tail 116 may be connected to test module 290 after electrical contacts 112 are connected to electrical contacts 242. Connection 218 connects test module 290 to HGA 240 to allow test module 290 to control and perform test operations on HGA 240. For example, test module 290 may perform read and write operations on test disc 260 at one or more radii on test disc 260. During testing of HGA 240, test module 290 may determine if HGA 240 meets defined standards required for including HGA 240 in a disc drive assembly. The defined standards may include minimum signal strength, fly height and/or other standards necessary to ensure proper operation of HGA 240 in a disc drive assembly.

Figure 3:
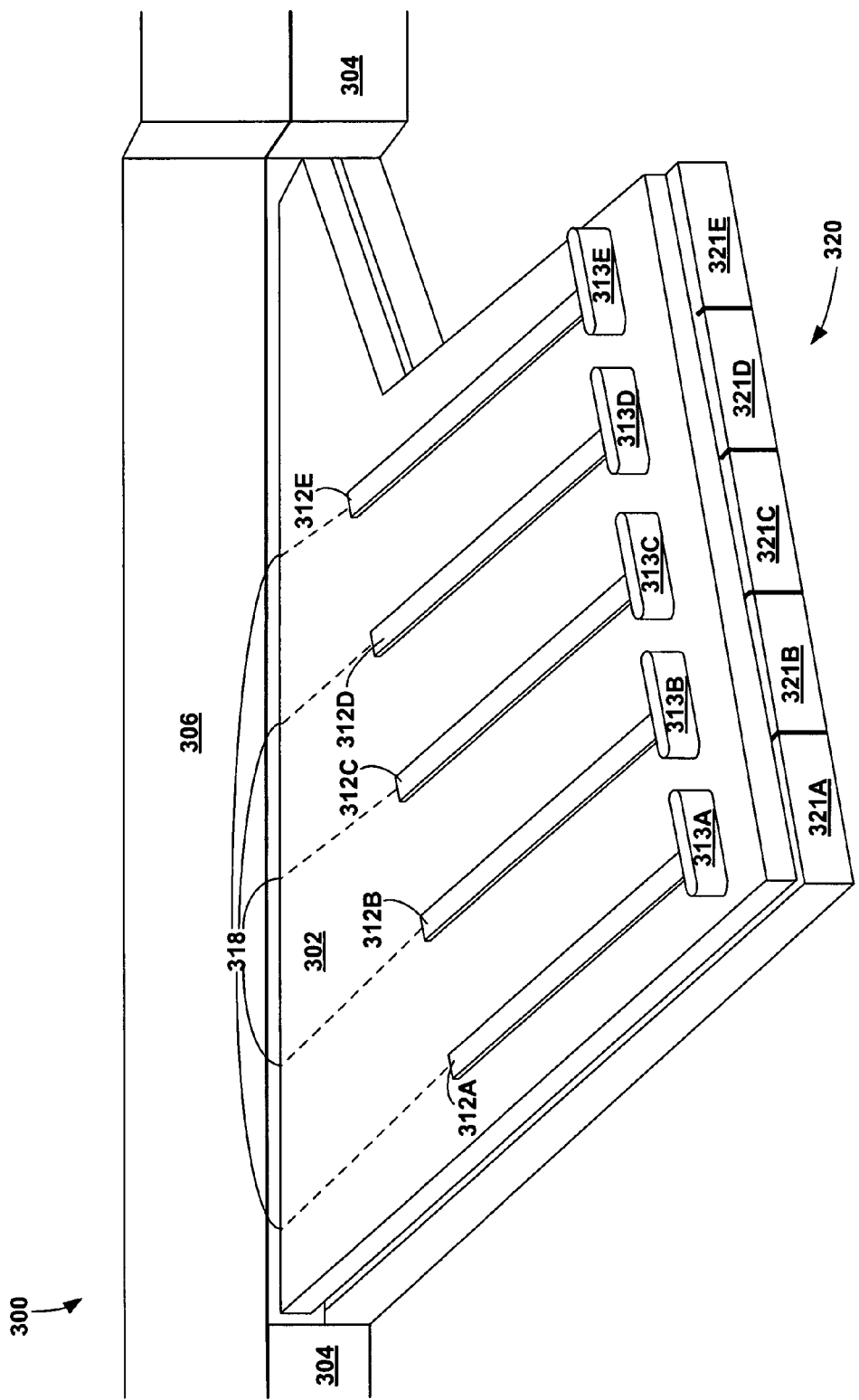
FIG. 3 illustrates a flex circuit design that provides an alternative to the flex circuit included in the assembly of FIGS. 1A-1C.

FIG. 3 illustrates a portion of assembly 300, which is substantially similar to assembly 100 (FIGS. 1A-1C) except that flex circuit 302 does not include slits. For brevity, details of the assembly including flex circuit 302 that are the same or similar to assembly 100 are not discussed in great detail with respect to FIG. 3.

Flex circuit 302 is mounted between bottom cover 306 and top cover 304. Top cover 304 includes compliant support backing 320. Bottom cover 306 and top cover 304 may be made from metal, such as aluminum or stainless steel, plastic or other material. Bottom cover 306 and top cover 304 combine to substantially enclose flex circuit 302.

Flex circuit 302 includes electrical contacts 312A-312E ("electrical contacts 312"), which are configured to connect to electrical contacts on a separate electronic component, such as an HGA. As shown in FIG. 3, electrical contacts 312 include raised pads 313A-113E ("pads 313"). Pads 313 are part of electrical contacts 312 and comprise an electrically conductive material, such as copper. Pads 313 are higher than traces 318 and the other portions of electrical contacts 312. As an example, pads 313 may be formed using plating techniques. In such an example, pads 313 may be formed from one or more layers over plated directly on top of electrical contacts 312. One advantage of plating techniques is that no solder is required to attach pads 313 to the remaining portions of electrical contacts 312.

Electrical contacts 312 are supported by compliant support backing 320, which is part of top cover 304. Compliant support backing 320 is much stiffer than the substrate of flex circuit 302. Generally, compliant support backing 320 is the same material as top cover 304. For example, compliant support backing 320 may be made from metal, such as aluminum or stainless steel, plastic or other material. Compliant support backing 320 includes support elements 321A-321E ("support elements 321"). Support elements 321 individually support electrical contacts 312. The stiffness of support elements 321 provide a consistent contact pressure between electrical contacts 312 and electrical contacts on a device that connects to assembly 300.

Flex circuit 302 comprises a flexible substrate. For example, the flexible substrate may comprise plastic, a thin-metal film and/or other flexible material. The flexible substrate has enough flexibility such that electrical contacts 312 can move independently in conjunction with support elements 321. As compared to flex circuit 102, flex circuit 302 may maintain electrical contact 312 in a more consistent position than electrical contacts 112 of flex circuit 102 because flex circuit 312 does not include slits 117, which may allow fingers 119 to overlap or separate. This may increase the reliability of a connection with electrical contacts on a separate electronic device, such as an HGA.

Various embodiments of the invention have been described. However, various modifications can be made to the described embodiments. For example, embodiments were described with respect to a flex circuit in conjunction with a compliant support backing. In other embodiments, substrate of a circuit including a set of electrical contacts may be both compliant and sufficiently stiff to provide sufficient contact pressure between the set of electrical contacts an electrical contacts of a separate device. These and other embodiments are within the scope of the following claims.

The invention claimed is:

1. An assembly comprising:
   a flex circuit including a first set of electrical contacts on a first side of the flex circuit, wherein the first set of electrical contacts is configured to connect to a second set of electrical contacts on an electronic component; and
   a compliant support backing adjacent a second side of the flex circuit and opposite the first set of electrical contacts, wherein the compliant support backing includes a set of support elements that individually support the first set of electrical contacts to increase the contact pressure between the first set of electrical contacts and the second set of electrical contacts when the flex circuit is connected to the electronic component,
   wherein the set of support elements is substantially flat.

2. The assembly of claim 1, wherein the first set of electrical contacts include raised pads located on a set of traces on the flex circuit.

3. The assembly of claim 2, wherein the raised pads comprise plated electrical contacts.

4. The assembly of claim 1, wherein the compliant support backing comprises metal.

5. The assembly of claim 1, wherein the compliant support backing forms at least part of a cover that substantially covers the second side of the flex circuit.

6. The assembly of claim 5, wherein the cover comprises metal.

7. An assembly comprising:
   a flex circuit including a first set of electrical contacts on a first side of the flex circuit, wherein the first set of electrical contacts is configured to connect to a second set of electrical contacts on an electronic component; and
   a compliant support backing adjacent a second side of the flex circuit and opposite the first set of electrical contacts, wherein the compliant support backing includes a set of support elements that individually support the first set of electrical contacts to increase the contact pressure between the first set of electrical contacts and the second set of electrical contacts when the flex circuit is connected to the electronic component,
   a top cover and a bottom cover, wherein the bottom cover substantially covers the first side of the flex circuit except for a portion adjacent to the first set of electrical contacts.

8. The assembly of claim 7, wherein the bottom cover forms a recess sized to hold the flex circuit.

9. The assembly of claim 1, further comprising at least one preamp that connects to the first set of electrical contacts.

10. The circuit of claim 9, wherein the at least one preamp is located on the flex circuit adjacent to the first set of electrical contacts.

11. The assembly of claim 1, wherein the electronic component is a head gimbal assembly.

12. A circuit comprising:
   a substantially flat substrate;
   set of traces that terminate near an edge of the substrate; and
   a set of plated electrical contacts that connect to the set of traces, wherein the set of plated electrical contacts is located near the edge of the substrate,
   wherein the substrate includes a relief between each of the set of plated electrical contacts.

13. The circuit of claim 12, wherein the substrate is flexible.

14. The circuit of claim 13, wherein the substrate comprises plastic.

15. The circuit of claim 12, further comprising at least one preamp that connects to the set of plated electrical contacts via the set of traces.

16. The circuit of claim 15, wherein the at least one preamp is located adjacent to the set of plated electrical contacts.

17. The circuit of claim 12, wherein the set of plated electrical contacts is higher than the set of traces relative to the substrate.

18. The circuit of claim 12, wherein the relief between each of the set of plated electrical contacts is configured to coincide with a set of support elements that individually support each of the set of plated electrical contacts.

* * * * *